(12) United States Patent
Peyer et al.

(10) Patent No.: US 8,949,761 B2
(45) Date of Patent: Feb. 3, 2015

(54) TECHNIQUES FOR ROUTING SIGNAL WIRES IN AN INTEGRATED CIRCUIT DESIGN

(71) Applicant: International Business Machines Corporation, Armonk, NY (US)

(72) Inventors: Sven Peyer, Tuebingen (DE); Matthias Ringe, Bonn (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/690,209

(22) Filed: Nov. 30, 2012

(65) Prior Publication Data

US 2014/0157221 A1 Jun. 5, 2014

(51) Int. Cl.
*G06F 17/50* (2006.01)
(52) U.S. Cl.
CPC .................. *G06F 17/5077* (2013.01)
USPC ............................ 716/129; 716/126; 716/130
(58) Field of Classification Search
USPC ........................................................ 716/129
See application file for complete search history.

(56) References Cited

U.S. PATENT DOCUMENTS

| 6,510,545 | B1 | 1/2003 | Yee et al. | |
|---|---|---|---|---|
| 7,107,563 | B1* | 9/2006 | Kong | 716/128 |
| 7,340,710 | B1 | 3/2008 | Hoerold et al. | |
| 8,122,412 | B2 | 2/2012 | McElvain et al. | |
| 2005/0269701 | A1* | 12/2005 | Tsuji et al. | 257/738 |
| 2011/0214100 | A1* | 9/2011 | McElvain | 716/130 |

OTHER PUBLICATIONS

Saxena, P., On Integrating Power and Signal Routing for Shield Count Minimization in Congested Regions, IEEE Xplore, Apr. 2003, pp. 437-445, Volure 22, Issue: 4, US.

Saxena et al., Shield Count Minimization in Congested Regions, ISPD, Apr. 7-10, 2002, San Diego, California US.

Xiong et al., Full-Chip Multilevel Routing for Power and Signal Integrity, Integration, the VLSI Journal 40 (2007), pp. 226-234, Los Angeles, California US.

* cited by examiner

*Primary Examiner* — Paul Dinh
*Assistant Examiner* — Bryce Aisaka
(74) *Attorney, Agent, or Firm* — Yudell Isidore PLLC

(57) ABSTRACT

A technique for routing signal wires in an integrated circuit design includes applying a first rule that attempts to route a signal wire along existing power supply shapes of the integrated circuit design and applying a second rule that provides shield wires along segments of the signal wire that are not routed along one of the existing power supply shapes. The technique also includes routing the signal wire between a first endpoint and a second endpoint while applying the first and second rules to substantially minimize a route cost for the signal wire between the first and second endpoints.

20 Claims, 8 Drawing Sheets

TECHNIQUES FOR ROUTING SIGNAL WIRES IN AN INTEGRATED CIRCUIT DESIGN

BACKGROUND

The present invention generally relates to routing wires in an integrated circuit design and, in particular, to techniques for routing signal wires in an integrated circuit design.

Wire routing (routing) is one step in the electronic design of integrated circuits (ICs) and printed circuit boards (PCBs). Wire routing builds on a preceding placement step, which determines the location of each active element of an IC or component on a PCB. After placement, the routing step adds wires needed to properly connect the placed elements or components while obeying all design rules. Routers are typically provided with pre-existing polygons for pins (or terminals) of cells and some pre-existing wiring (or pre-routes). Each of the polygons are associated with a net, usually by name or number. The primary task of a router is to create geometries such that all terminals assigned to the same net are connected, no terminals assigned to different nets are connected, and all design rules are obeyed.

A router can fail by not connecting terminals that should be connected (an open), by connecting two terminals that should not be connected (a short), and/or by violating a design rule. Routers may also be configured to ensure an electronic design meets timing requirements, has no crosstalk problems, meets any metal density requirements, and/or does not suffer from antenna effects, etc. Almost every problem associated with routing is known to be intractable. The simplest routing problem (commonly referred to as a Steiner Tree Problem) of finding the shortest route for one net in one layer with no design rules is NP-hard, even if only horizontal and vertical wires are allowed. Variants of channel routing, as well as routing to reduce crosstalk, the number of vias, etc., have also been shown to be NP-complete. In practice, routers seldom attempt to find an optimum result. That is, routers typically attempt to find a solution that is good enough based on some established criteria.

Design rules for ICs sometimes vary considerably from layer to layer. For example, the allowed width and spacing on lower metal layers may be four or more times smaller than the allowed width and spacing on upper metal layers. Different wire width and wire spacing for different metal layers of an IC results in additional complications not faced by routers for other applications, e.g., PCB or multi-chip module (MCM) design. In particular, difficulties ensue if the design rules are not simple multiples of each other and when vias must traverse between layers with different rules. The earliest types of electronic design automation (EDA) routers were manual routers, i.e., a designer clicked a mouse on an endpoint of each line segment of each net to route a wire. Modern electronic design software typically provides interactive routers, i.e., a designer selects a pad and clicks a few places to give the router an idea of where to go and the router attempts to place wires as close to that path as possible without violating design rules.

Some more advanced interactive routers have 'push' and 'shove' features that allow the routers to push nets out of the way, if possible, in order to place a new wire where a designer wants the wire and still avoid violating design rules. Modern EDA software also typically provides auto-routers, which route remaining un-routed connections without human intervention. Auto-routers may take various forms. For example, an auto-router may take the form of a maze router, a line probe router, a channel router, an area router, or a switchbox router.

An auto-router may, for example, first determine an approximate course for each net, e.g., route on a coarse grid or perform global routing. In general, global routing limits the size and complexity of subsequent detailed routing steps, which can be done square-by-square on a routing grid.

For detailed routing, the most common technique is rip-up and reroute, which includes: selecting a sequence in which the nets are to be routed; routing each net in the sequence; and, if not all nets can be successfully routed, applying any of a variety of clean-up methods, in which selected routings are removed, the order of the remaining nets to be routed is changed, and the remaining routings are attempted again. In general, the rip-up and reroute technique repeats until all nets are routed or the routing program (or a user of the program) gives up. An alternative multi-pass iterative-improvement routing approach treats shorts, design rule violations, obstructions, etc. on a similar footing as excess wire length, i.e., as finite costs to be reduced (at first) rather than as absolutes to be avoided. The multi-pass iterative-improvement routing approach, for each of several iterative passes, includes: prescribing or adjusting weight parameters of an objective function (having a weight parameter value for each unit of excess wire length, and for each type of design rule violation).

For example, in the multi-pass iterative-improvement routing approach, during a first pass excess wire length may typically be given a high cost, while design violations such as shorts, adjacency, etc. are given a low cost. In later passes, the relative ordering of costs is changed so that violations are high-cost or may be prohibited. A sequence in which nets are to be routed during the pass are then selected or randomly chosen. Each net, in turn, is then ripped-up (if previously routed) and re-routed so as to minimize the value of the objective function for the net. Typically, some of the routings will have shorts or other design rule violations. A next iterative pass is then processed until routing is complete and correct, is not further improved, or some other termination criterion is satisfied. Most routers assign wiring layers to carry predominantly 'x' or 'y' directional wiring, although there are routers that avoid or reduce the need for directional wiring assignment. In general, restricting wiring direction simplifies power supply design and control of inter-layer crosstalk. However, allowing arbitrary routes may reduce the need for vias and decrease the number of required wiring layers.

BRIEF SUMMARY

Disclosed are a method, a data processing system, and a computer program product (embodied on a computer-readable storage medium) for routing signal wires in an integrated circuit design to take advantage of existing power supply shapes as shields.

A technique for routing signal wires in an integrated circuit design includes applying a first rule that attempts to route a signal wire along existing power supply shapes of the integrated circuit design and applying a second rule that provides shield wires along segments of the signal wire that are not routed along one of the existing power supply shapes. The technique also includes routing the signal wire between a first endpoint and a second endpoint while applying the first and second rules to substantially minimize a route cost for the signal wire between the first and second endpoints.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

Figure 1:
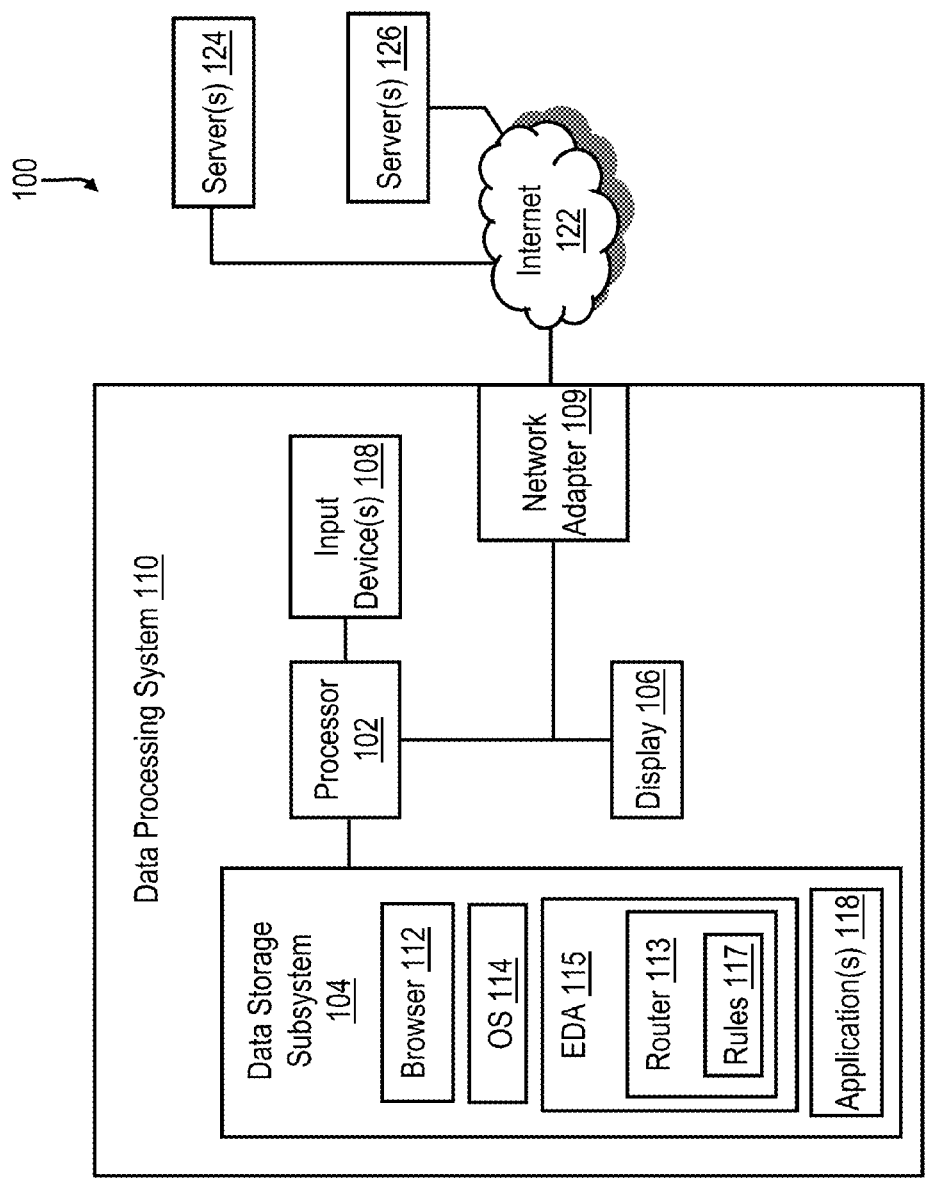
FIG. 1 is a diagram of a relevant portion of an exemplary data processing system environment that includes a data processing system that executes electronic design automation (EDA) software that is configured, in accordance with various embodiments of the present disclosure, to route signal wires in an integrated circuit design along existing power supply shapes where feasible.

The illustrative embodiments provide a method, a data processing system, and a computer program product (embodied on a computer-readable storage medium) for routing signal wires in an integrated circuit design to take advantage of existing power supply shapes as shields.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

A shielded wire in an integrated circuit (chip) is a wire that is enclosed by one or more neighboring shapes on the same metal layer that are connected to one or more power supply nodes. In general, shielding a signal wire reduces the impact of noise caused by capacitive and inductive coupling on a signal carried by the signal wire. For certain types of signal wires, e.g., clock signal wires, shielding is highly desirable, especially at higher frequencies. As used herein, the term 'shield sharing' refers to routing signal wires in close proximity to existing power supply shapes that are connected to a power supply node via an existing power supply mesh. According to the present disclosure, techniques are disclosed that provide shielded wires by employing shield sharing when possible and utilize composite shielded wires otherwise. According to the present disclosure, shield sharing utilizes an existing power supply mesh to shield signal wires where feasible.

As used herein, the term 'netlist' describes the connectivity of a cell of an electronic design. A netlist includes 'ports', 'instances', 'nets', and 'pins'. Ports are the external interface of a cell. An instance is a reference to a cell and ports of the cell are referred to as pins. A net is the logical connection of multiple pins or ports. In general, zero or one pin nets may exist. Routing of wires for an electronic design is generally performed on a three-dimensional (3D) grid that forms a graph that includes vertices and edges, which are each covered by at most one object. It should be appreciated that a routing grid may be different on different metal layers. In general, the main goal of a router is to embed all desired connections while meeting various requirements, e.g., spacing rules. As used herein, a 'segment' is a part of a wire that is bounded by two endpoints and a 'via' is a segment in the 'z' direction that spans exactly one edge of a routing grid. Pin shapes are the physical representation of a pin. Different pins may have multiple disjoint pin shapes. Port shapes are the physical representation of a port. Different ports may have multiple disjoint port shapes.

A wire includes a path of segments and vias that connect multiple pins or port shapes of the same net. In general, a wire is the physical representation of a net. The term 'shape' refers to two-dimensional (2D) objects on a same metal layer. A wire code defines physical properties of segments on each allowable metal layer. The physical properties typically include a wire width and minimum spacing to other shapes on the same (or occasionally different) metal layers. A wire code may be restricted to a certain range of metal layers. A wire may have multiple allowable wire codes with different associated costs. The total cost of a wire is the sum of each segment multiplied by the cost of the wire code being used on the segment. A segment with its wire code applied has a physical representation based on utilized shapes. A wire code may be composed of multiple non-connected shapes.

With reference to FIG. 1, an exemplary data processing environment 100 is illustrated that includes a data processing system 110 that is configured to route signal wires in an integrated circuit design to take advantage of existing power supply shapes as shields according to one or more embodiments of the present disclosure. Data processing system 110 may take various forms, such as workstations, laptop computer systems, notebook computer systems, or desktop computer systems and/or clusters thereof. Data processing system 110 includes a processor 102 (which may include one or more processor cores for executing program code) coupled to a data storage subsystem 104, a display 106, one or more input devices 108, and a network adapter 109. Data storage subsystem 104 may include, for example, application appropriate amounts of various memories (e.g., dynamic random access memory (DRAM), static RAM (SRAM), and read-only memory (ROM)), and/or one or more mass storage devices, such as magnetic or optical disk drives.

Data storage subsystem 104 includes an operating system (OS) 114 for data processing system 110. Data storage subsystem 104 also includes application programs, such as a browser 112 (which may optionally include customized plug-ins to support various client applications), and other applications (e.g., a word processing application, a presentation application, and an email application) 118, as well as electronic design automation (EDA) software 115, which implements a router 113 configured according to one or more aspects of the present disclosure to route signal wires (based on rules 117) in an integrated circuit design to take advantage of existing power supply shapes as shields.

Display 106 may be, for example, a cathode ray tube (CRT) or a liquid crystal display (LCD). Input device(s) 108 of data processing system 110 may include, for example, a mouse, a keyboard, haptic devices, and/or a touch screen. Network adapter 109 supports communication of data processing system 110 with one or more wired and/or wireless networks utilizing one or more communication protocols, such as 802.x, HTTP, simple mail transfer protocol (SMTP), etc. Data processing system 110 is shown coupled via one or more wired or wireless networks, such as the Internet 122, to various file servers 124 and various web page servers 126 that provide information of interest to the user of data processing system 110.

Those of ordinary skill in the art will appreciate that the hardware components and basic configuration depicted in FIG. 1 may vary. The illustrative components within data processing system 110 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

Figure 2:
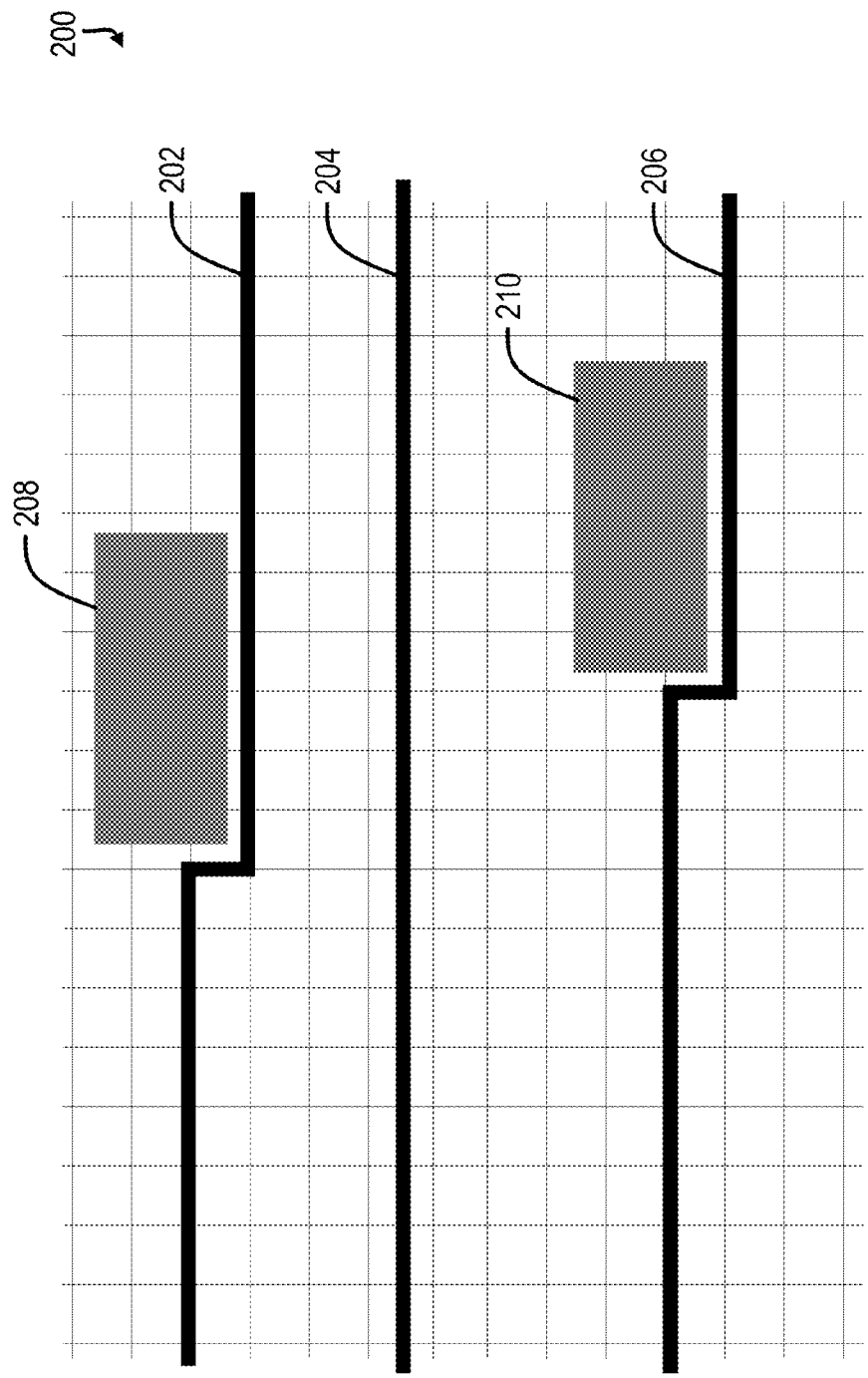
FIG. 2 is a exemplary routing grid that illustrates the routing of signal wires in the presence of blockages.

With reference to FIG. 2, a relevant portion of an exemplary routing grid 200 is depicted that includes three routed signal wires 202, 204, and 206 and two blockages 208 and 210 on a particular metal layer. As is shown, signal wire 202 has been routed around blockage 208 and signal wire 206 has been routed around blockage 210. In contrast, signal wire 204 is routed straight across routing grid 200 as there are no blockages in a path of signal wire 204. According to one or more embodiments of the present disclosure, a router for which a segment of a wire code is represented as a wide segment is assumed, while the physical implementation includes the true shapes.

Figure 3:
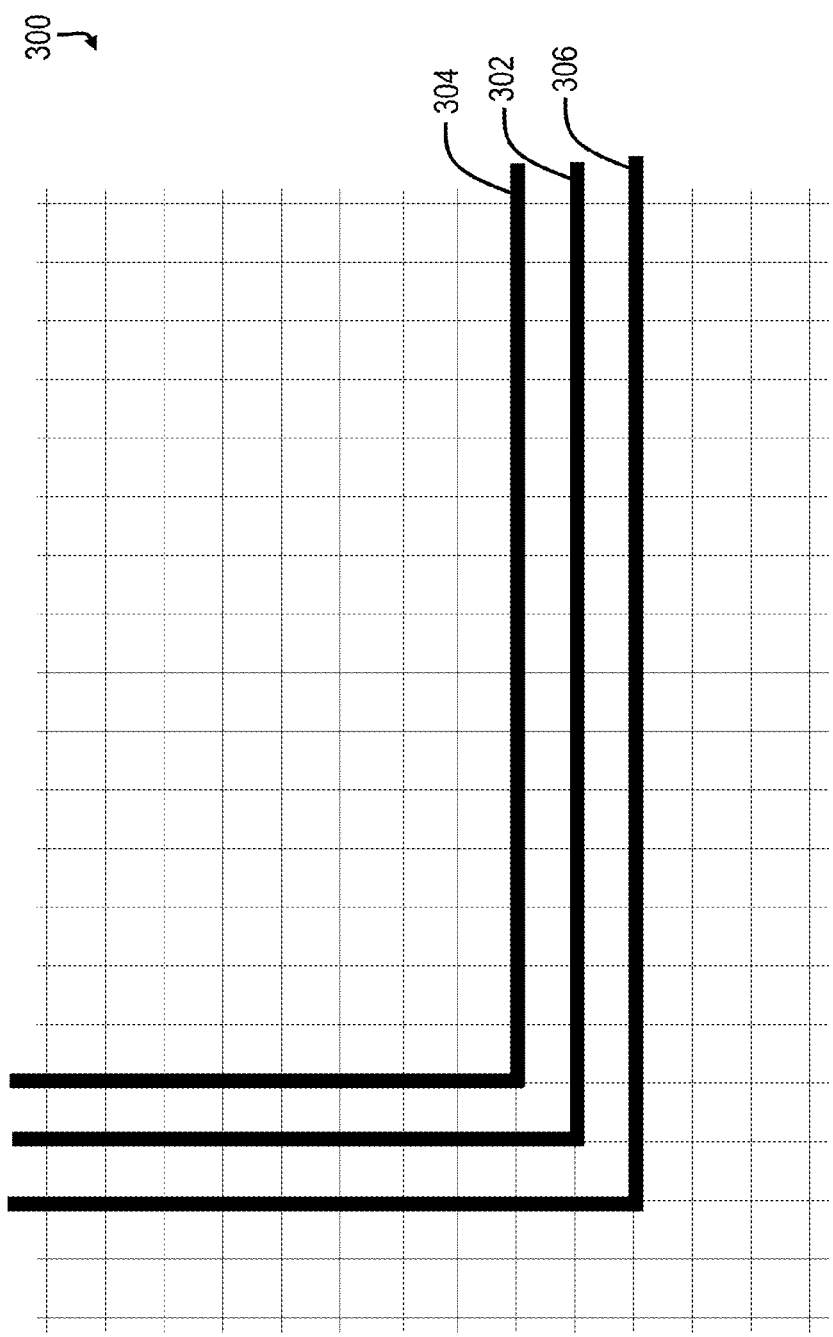
FIG. 3 is a exemplary routing grid that illustrates the routing of a signal wire with shield wires (one connected to VDD and the other connected to VSS) on each side of the signal wire.
Figure 4:
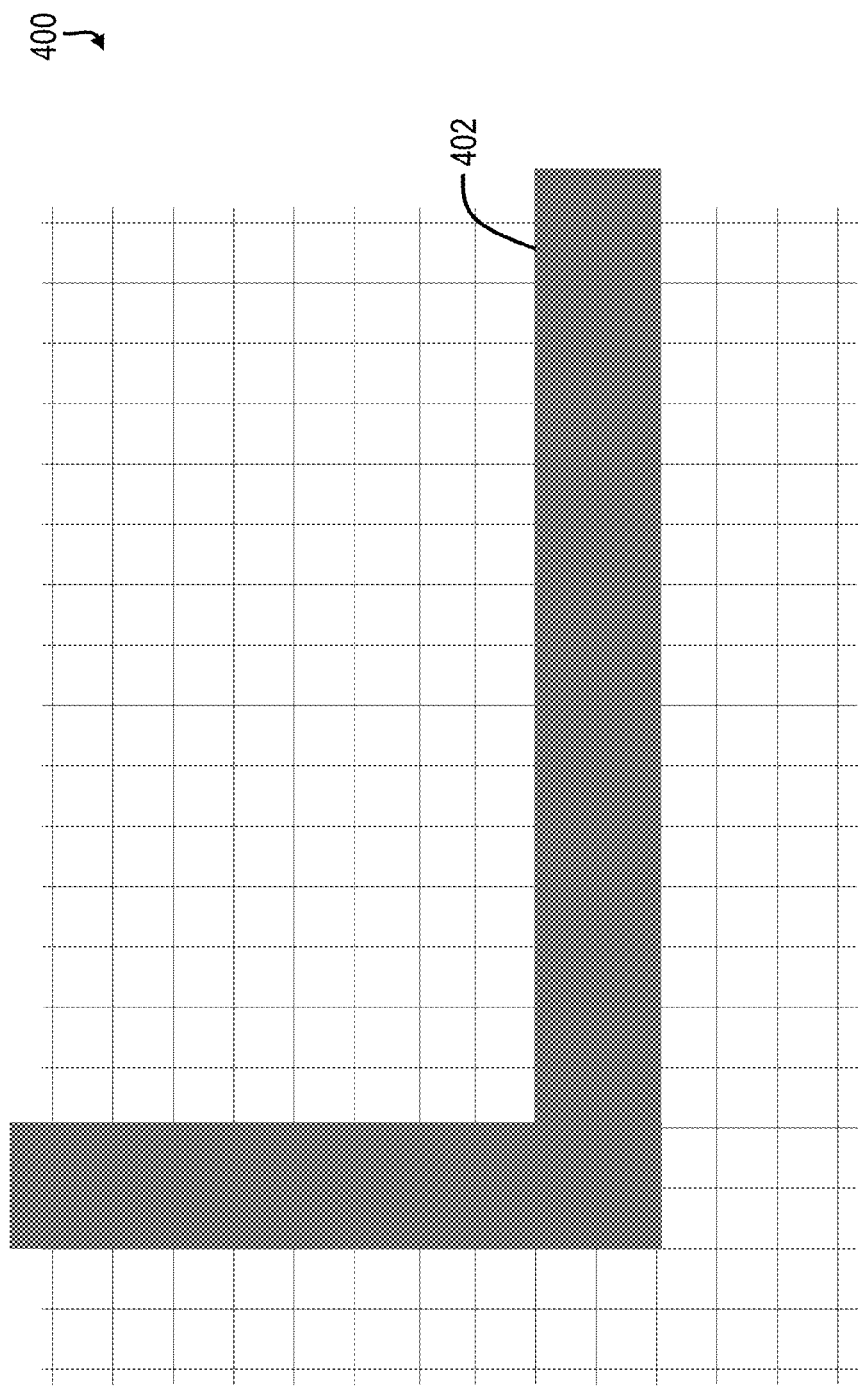
FIG. 4 is a exemplary routing grid that illustrates a wide wire representation of the shielded wire of FIG. 3.

With reference to FIG. 3, a physical view of a shielded wire on routing grid 300 is illustrated that includes a central signal wire 302 and adjacent shield wires 304 and 306 that are connected to VDD and VSS (i.e., ground), respectively. It should be appreciated that signal wire 302 does not employ shield sharing. That is, signal wire 302 is not shielded by any existing power supply shape that is connected to an appropriate power supply voltage node. Instead, signal wire 302 is shielded by dedicated shield wires (i.e., shield wires 304 and 306). With reference to FIG. 4, a wide wire representation 402 of signal wire 302 and adjacent shield wires 304 and 306 is illustrated on routing grid 400. An area of wide wire representation 402 may, for example, be employed to determine a routing cost for signal wire 302 across routing grid 400.

Figure 5:
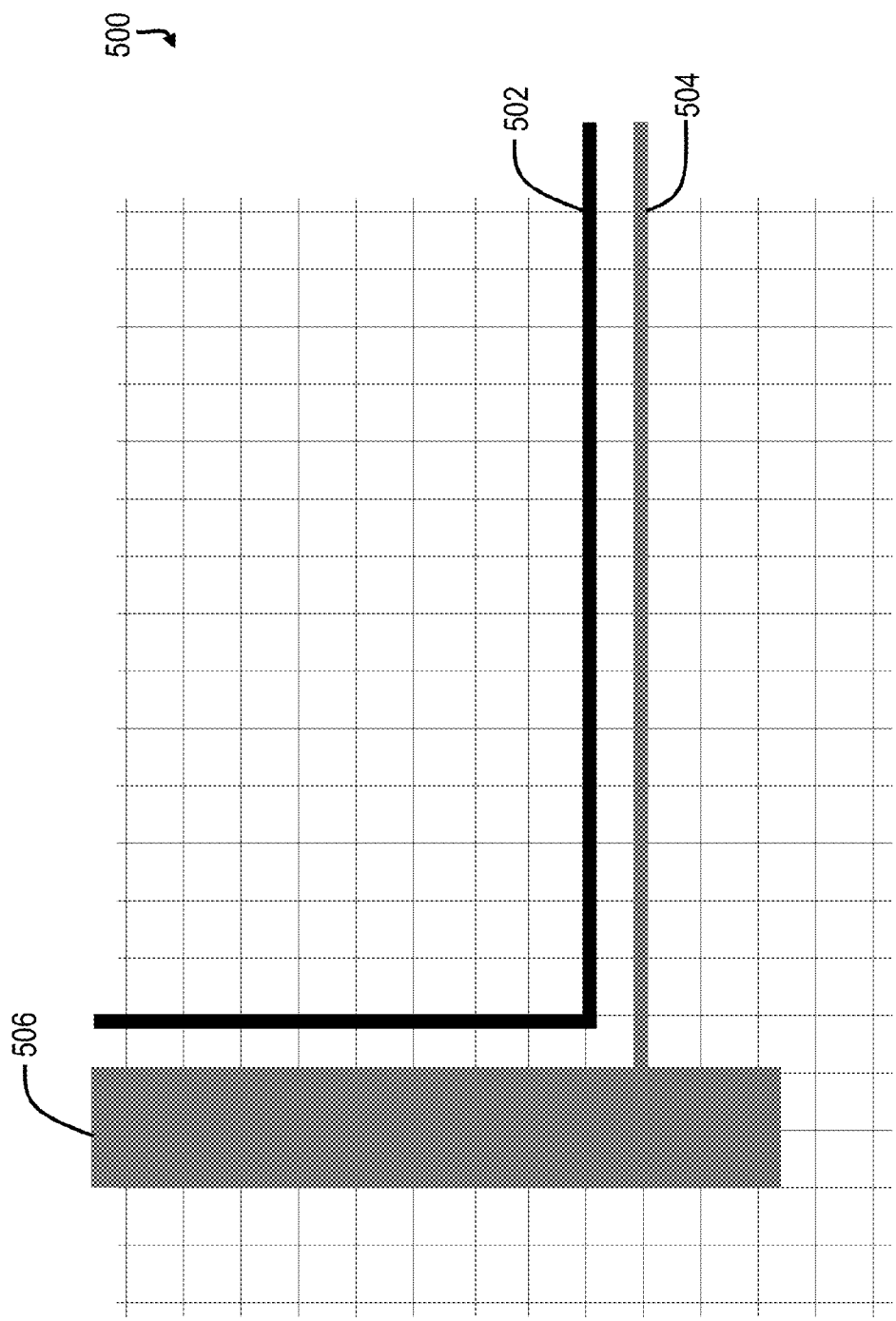
FIG. 5 is a exemplary routing grid that illustrates the routing of a signal wire along an existing power supply shape to the extent possible and addition of a shield wire along a segment of the signal wire that is not routed along the existing power supply shape in accordance with an embodiment of the present disclosure.

With reference to FIG. 5, a horizontal portion of signal wire 502 is illustrated as utilizing two tracks (i.e., a first track for signal wire 502 and a second track for shield wire 504) on routing grid 500, while a vertical portion of signal wire 502 uses a single track on routing grid 500 as a shield is provided by existing power supply shape 506. In the present disclosure, the discussion focuses on a router that is based on pattern and shape classes. That is, every shape belongs to a shape class and patterns define illegal combinations of shape classes. Patterns are direction-dependent, which means symmetric scenarios require two patterns with swapped entries. For example, assume that on a metal layer with a horizontal preferred wiring direction a signal wire is required to be located above ground. A wire code for ensuring that the signal wire is located above ground may be defined using the following exemplary shape classes:
  shape_class__0 (empty space)
  shape_class__1 (the wire code for the signal wire)
  shape_class__2 (the wire code for the ground)
  shape_class__3 (the wire code of any other shape)
Patterns for the shape classes may then be defined as follows:
  (shape_class__0, shape_class__1) disallow empty space below
  (shape_class__1, shape_class__1) disallow the same wire code below
  (shape_class__3, shape_class__1) disallow any other wire code below
According to a different aspect of the present disclosure, a shape class may be modified by the "!" or "not" operator to indicate any other shape but the operand shape.

In general, the disclosed techniques attempt to create shielded wires with minimum usage of shield wires. As used herein, a 'shielded wire code' is a composite wire code that includes a signal component and one or more shield components. Each component may be of an arbitrary but predefined width. As used herein a 'power hugging wire code' may be a composite or non-composite wire code and is located in proximity to an appropriate power supply shape. Compared to the shielded wire code, the power hugging wire code lacks an outer shield component, i.e., the outer shield component that is replaced by the power supply shape. In general, according to the present disclosure, wire segments between endpoints that are associated with a shielded wire code have a higher cost than wired codes associated with a power hugging wire code. A wire code for a wire routed according to the present disclosure is a composite wire code that may include an arbitrary number of signal and shield components with at least one outer shield component that is connected to a predefined power supply shape of an existing power supply net. The goal of the power hugging wire code is to have wires laid out in proximity of existing power supply shapes that are connected to a predefined power supply voltage node.

According to one aspect of the present disclosure, exemplary shape classes may be defined as follows:
  shape_class__0 (empty space)
  shape_class__1 (the wire code for the signal wire)
  shape_class__2 (the wire code of a predefined power supply shape)

shape_class_3 (the wire code of any other shape)

According to another aspect of the disclosure, a desired layout may be ensured by specified patterns as follows:

(shape_class_0, shape_class_1, !shape_class_2);
(!shape_class_2, shape_class_1, shape_class_0);

which disallow combinations of empty space on one side and no appropriate power supply shape on the opposite side of the signal wire;

(shape_class_1, shape_class_1, !shape_class_2);
(!shape_class_2, shape_class_1, shape_class_1);

which disallow combinations of a signal wire on one side and no appropriate power supply shape on the opposite side of the signal wire; and (shape_class_3, shape_class_1, !shape_class_2);
(!shape_class_2, shape_class_1, shape_class_3);

which disallow combinations of any other shape on one side and no appropriate power supply shape on the opposite side of the signal wire.

The above wire codes dictate that a signal wire must be located next to a single dedicated power supply shape. It should be appreciated that a similar approach may be applied if multiple power supply nets are utilized, i.e., a shield wire code that has a first power supply shape (i.e., a VDD shape) on one side and a second power supply shape (i.e., a VSS shape) on an opposite side. It should be appreciated that each segment with a certain wire code has an associated cost. In general, a sum of all segment costs of a signal wire forms the total cost for the signal wire. According to one or more aspects of the present disclosure, a router is configured to select a specific signal wire route based on the total cost. As noted above, a composite wire (i.e., a signal wire with an associated shield wire) typically has a higher cost than a power hugging wire (i.e., a signal wire that is routed along a power supply shape, which functions as a shield for the signal wire).

Figure 6:
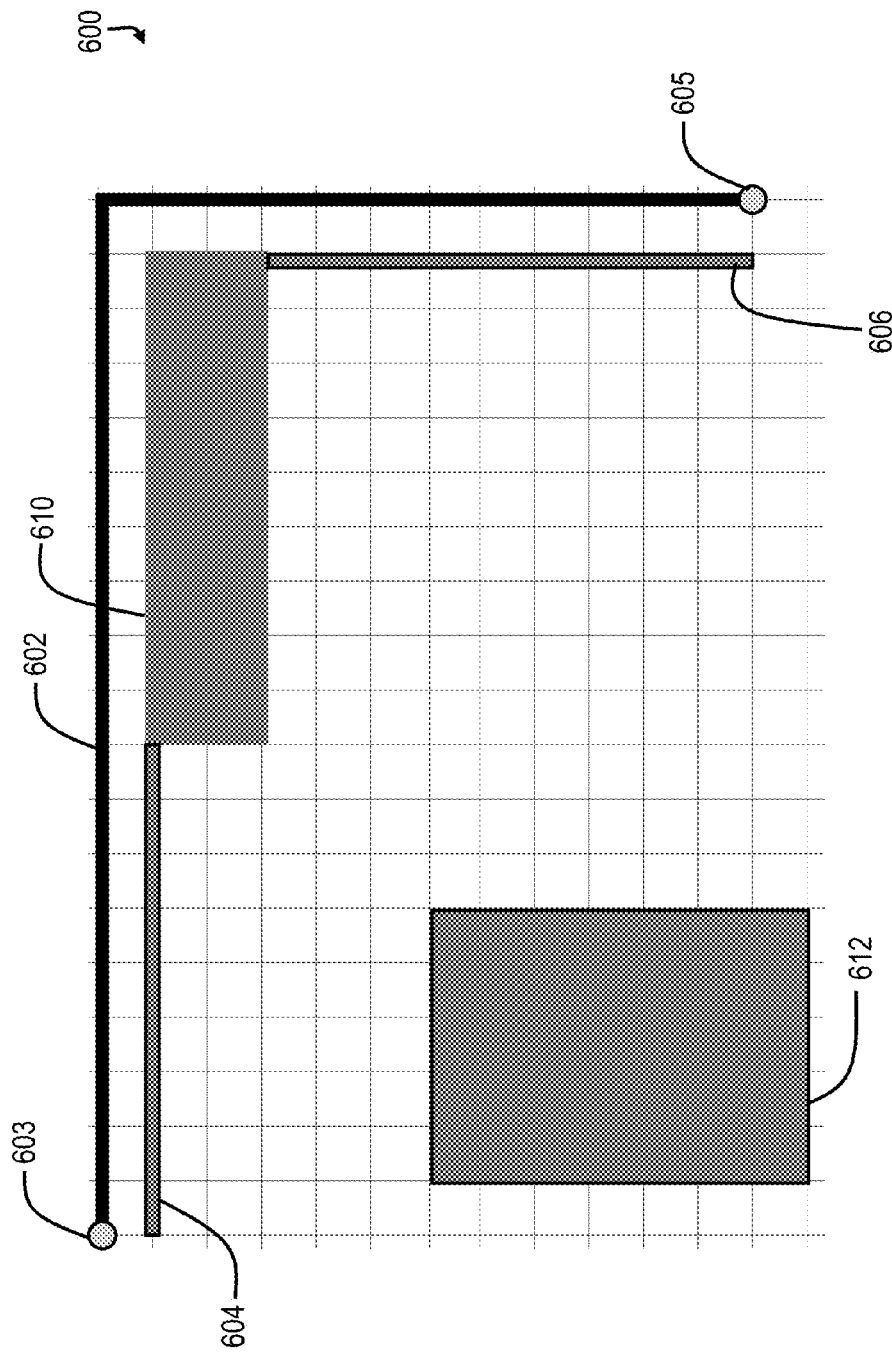
FIG. 6 is a exemplary routing grid that illustrates a first potential route for a signal wire between endpoints along a first existing power supply shape and addition of shield wires along portions of the signal wire that are not routed along the first existing power supply shape in accordance with an embodiment of the present disclosure.

With reference to FIG. 6, a routing grid 600 depicts an exemplary routing for a signal wire 602 between endpoints 603 and 605. As is illustrated, a part of the horizontal portion of signal wire 602 is routed along power supply shape 610. For example, power supply shape 610 may be coupled to a positive power supply node or ground. Due to the routing of signal wire 602 horizontally along power supply shape 610, a first shield wire 604 is required to horizontally extend from power supply shape 610 to endpoint 603. Similarly, due to the routing of signal wire 602 vertically along power supply shape 610 a second shield wire 606 is required to vertically extend from power supply shape 610 to endpoint 605. From review of routing grid 600 it should be evident that router 113 did not, at least in this iteration, route signal wire 602 adjacent to power shape 612.

Figure 7:
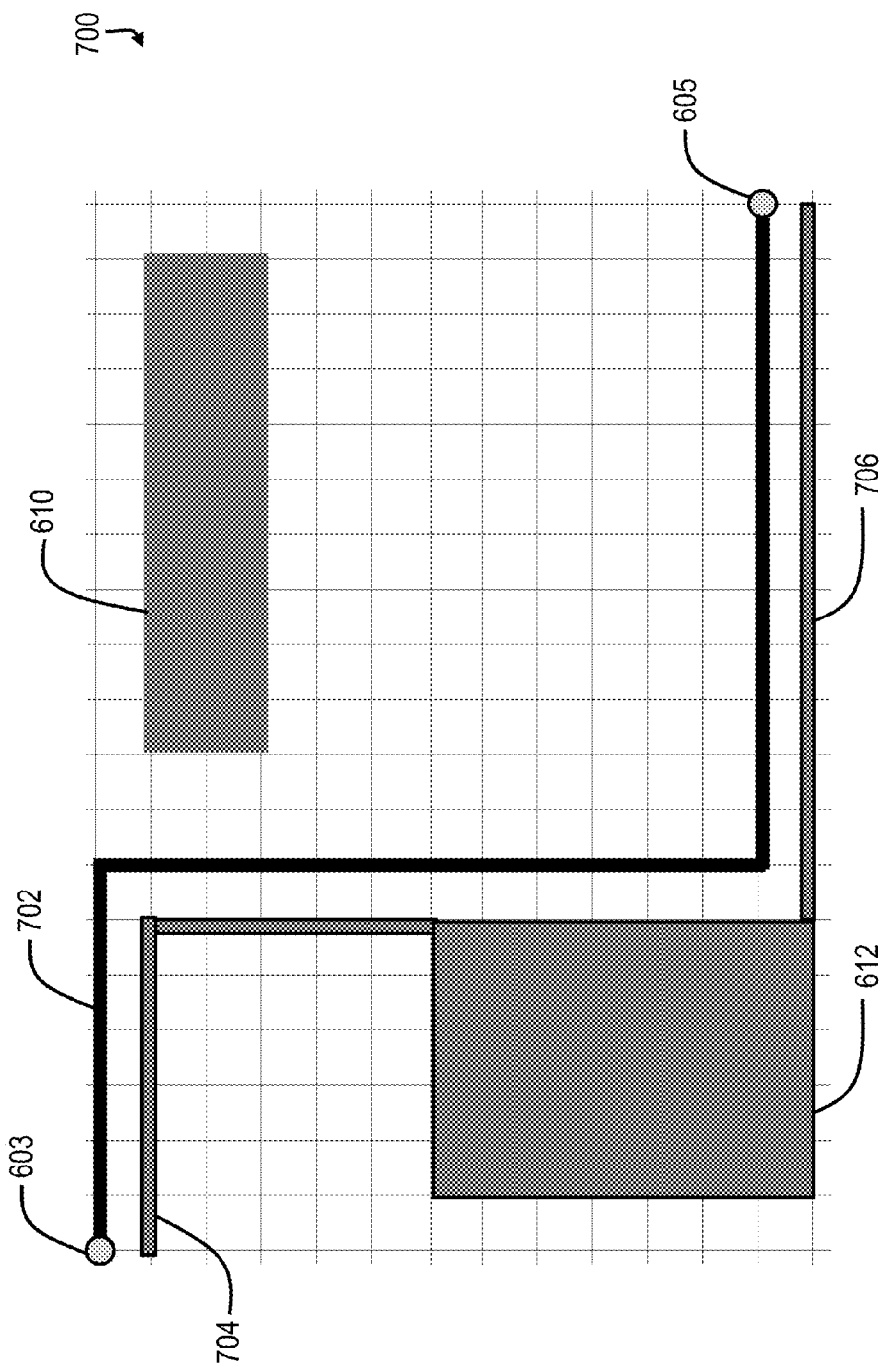
FIG. 7 is a exemplary routing grid that illustrates a second potential route for a signal wire between the endpoints of FIG. 6 along a second existing power supply shape and addition of shield wires along portions of the signal wire that are not routed along the second existing power supply shape in accordance with an embodiment of the present disclosure.

With reference to FIG. 7, a routing grid 700 depicts an exemplary routing of a signal wire 702 between endpoints 603 and 605. As is illustrated, a part of the vertical portion of signal wire 702 is routed along power supply shape 612. For example, power supply shape 612 may be coupled to a positive power supply node or ground. Due to the routing of signal wire 702 vertically along power supply shape 710 a first shield wire 704 is required to extend (first vertically and then horizontally) from power supply shape 612 to endpoint 602. Similarly, due to the routing of signal wire 702 vertically, a second shield wire 706 is required to horizontally extend from power supply shape 612 to endpoint 605. From review of routing grid 700 it should be evident that router 113 did not, at least in this iteration, route signal wire 702 adjacent to power shape 610.

In calculating a route cost for routing signal wires 602 and 702 between endpoints 603 and 605 a number of different criteria may be employed. For example, a route cost may be based on a length of signal wires 602 and 702 between endpoints 603 and 605. As another example, a route cost may be based on a length of shield wires between first and second endpoints 603 and 605. As yet another example, a route cost may be based on a length of signal wires 602 and 702 between endpoints 603 and 605 and a length of shield wires between first and second endpoints 603 and 605. As yet another example, a route cost for a signal wire may be based on an area associated with the signal wire between first and second endpoints 603 and 605. Assuming a route cost is based solely on a length of signal wires 602 and 702 between endpoints 603 and 605, either of the routes depicted is equivalent as both routes require thirty-one units. Assuming a route cost is based solely on a length of shield wires between endpoints 603 and 605, signal wire 602 has a lower routing cost than signal wire 702 as shield wires 704 and 706 require twenty-four units while shield wires 604 and 606 only require eighteen units. Utilizing area consumed by a signal wire and shield wires between endpoints 603 and 605 yields a similar result as that produced based on a length of the shield wires.

Figure 8:
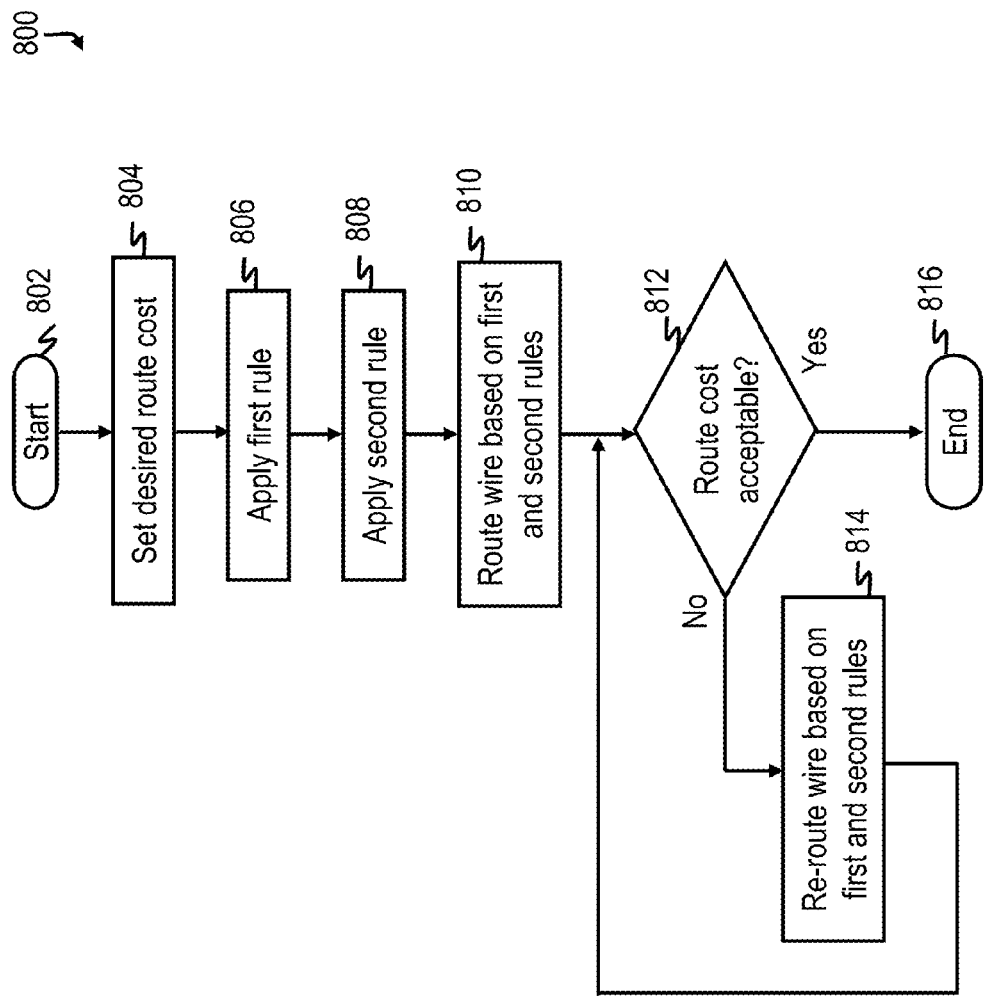
FIG. 8 is a flow chart of an exemplary process for routing signal wires in an integrated circuit design to take advantage of existing power supply shapes as shields according to one embodiment of the present disclosure.

With reference to FIG. 8, a flow chart of an exemplary process 800 for routing signal wires (e.g., signal wires configured to carry clock signals) in an integrated circuit design to take advantage of existing power supply shapes as shields, according to one embodiment of the present disclosure, is illustrated. For example, process 800 may be executed by processor 102 of data processing system 110. At block 802, process 800 is initiated (e.g., when a user of data processing system 110 initiates execution of EDA 115) at which point control transfers to block 804. In block 804, processor 102 sets a desired route cost for router 113. Next, in block 806, processor 102 applies a first rule that attempts to route a signal wire along existing power supply shapes of the integrated circuit design (see, for example, power supply shapes 610 and 612 of FIGS. 6 and 7). Then, in block 808, processor 102 applies a second rule that provides shield wires along segments of the signal wire that are not routed along one of the existing power supply shapes (see, for example, shield wires 604 and 606 of FIG. 6 and shield wires 704 and 706 of FIG. 7).

Next, in block 810, processor 102 routes a signal wire based on the first and second rules and determines a route cost for the signal wire. In calculating a route cost for routing signal wires 602 and 702 between endpoints 603 and 605 a number of different criteria may be employed. For example, a route cost may be based on a length of signal wires 602 and 702 between endpoints 603 and 605. As another example, a route cost may be based on a length of shield wires between first and second endpoints 603 and 605. As yet another example, a route cost may be based on a length of signal wires 602 and 702 between first and second endpoints 603 and 605 and a length of shield wires between first and second endpoints 603 and 605. As another example, a route cost for a signal wire may be based on an area associated with the signal wire between first and second endpoints 603 and 605.

Then, in decision block 812, processor 102 determines whether the route cost is acceptable (e.g., at or below the desired route cost). In response to the route cost not being acceptable in block 812 control transfers to block 814, where processor 102 re-routes the signal wire based on the first and second rules. From block 814, control returns to block 812. In response to the route cost being acceptable in block 812, control transfers to block 816 where process 800 terminates. Alternatively, instead optimizing the route cost using an iterative approach, the route cost may be directly optimized.

Accordingly, techniques have been disclosed herein that advantageously route signal wires in an integrated circuit design to take advantage of existing power supply shapes as shields.

In the flow charts above, the methods depicted in FIG. 8 may be embodied in a computer-readable medium containing computer-readable code such that a series of steps are performed when the computer-readable code is executed on a computing device. In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage subsystems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of routing signal wires in an integrated circuit design, the method comprising:
    applying, using a data processing system, a first rule that attempts to route a signal wire along existing power supply shapes of the integrated circuit design based on a first endpoint and a second endpoint identified for a signal wire to be routed within the integrated circuit design, wherein the existing power supply shapes are designed to distribute power and are not designed to function as shields;
    applying, using the data processing system, a second rule that provides shield wires along segments of the signal wire that are not routed along one of the existing power supply shapes, wherein each of the shield wires are connected to one of the existing power supply shapes that is adjacent to a segment of the signal wire; and
    routing, using the data processing system, the signal wire between the first endpoint and the second endpoint while applying the first and second rules;
    evaluate a route cost for the signal wire route, wherein the route cost is determined based on criteria including at least one of a length of the signal wire and a length of the shield wire for a corresponding route;
    compare the route cost to one or more of (i) another route cost for routing the signal wire via a different route and (ii) a pre-establish route cost desired; and
    select a final route of the signal wire that minimizes a route cost for the signal wire between the first and second endpoints.

2. The method of claim 1, wherein the route cost is based on a length of the signal wire between the first and second endpoints.

3. The method of claim 1, wherein the route cost is based on a length of the shield wires between the first and second endpoints.

4. The method of claim 1, wherein the route cost is based on a length of the signal wire between the first and second endpoints and a length of the shield wires between the first and second endpoints.

5. The method of claim 1, wherein the route cost is based on an area associated with the signal wire between the first and second endpoints.

6. The method of claim 1, wherein the signal wire is configured to carry a clock signal.

7. The method of claim 1, wherein the existing power supply shapes are part of an existing power mesh that is coupled to at least one of a first power supply node and a second power supply node.

8. A computer program product for routing signal wires in an integrated circuit design, the computer program product comprising:
    a computer-readable storage device having computer-readable program code embodied thereon, wherein the computer-readable program code, when executed by a processor, configures the processor to:
        apply a first rule that attempts to route a signal wire along existing power supply shapes of the integrated circuit design based on a first endpoint and a second endpoint identified for a signal wire to be routed within the integrated circuit design, wherein the existing power supply shapes are designed to distribute power and are not designed to function as shields;
        apply a second rule that provides shield wires along segments of the signal wire that are not routed along one of the existing power supply shapes, wherein each of the shield wires are connected to one of the existing power supply shapes that is adjacent to a segment of the signal wire; and
        route the signal wire between the first endpoint and the second endpoint while applying the first and second rules;
        evaluate a route cost for the signal wire, wherein the route cost is determined based on criteria including at least one of a length of the signal wire and a length of the shield wire for a corresponding route;

compare the route cost to one or more of (i) another route cost for routing the signal wire via a different route and (ii) a pre-establish route cost desired; and select a final route of the signal wire that minimizes a route cost for the signal wire between the first and second endpoints.

9. The computer program product of claim 8, wherein the route cost is based on a length of the signal wire between the first and second endpoints.

10. The computer program product of claim 8, wherein the route cost is based on a length of the shield wires between the first and second endpoints.

11. The computer program product of claim 8, wherein the route cost is based on a length of the signal wire between the first and second endpoints and a length of the shield wires between the first and second endpoints.

12. The computer program product of claim 8, wherein the route cost is based on an area associated with the signal wire between the first and second endpoints.

13. The computer program product of claim 8, wherein the signal wire is configured to carry a clock signal.

14. The computer program product of claim 8, wherein the existing power supply shapes are part of an existing power mesh that is coupled to at least one of a first power supply node and a second power supply node.

15. A data processing system, comprising:
a memory for storing code; and
a processor coupled to the memory, wherein the processor is configured to:
apply a first rule that attempts to route a signal wire along existing power supply shapes of the integrated circuit design based on a first endpoint and a second endpoint identified for a signal wire to be routed within an integrated circuit design, wherein the existing power supply shapes are designed to distribute power and are not designed to function as shields;
apply a second rule that provides shield wires along segments of the signal wire that are not routed along one of the existing power supply shapes, wherein each of the shield wires are connected to one of the existing power supply shapes that is adjacent to a segment of the signal wire; and
route the signal wire between a first endpoint and a second endpoint while applying the first and second rules;
evaluate a route cost for the signal wire, wherein the route cost is determined based on criteria including at least one of a length of the signal wire and a length of the shield wire for a corresponding route;
compare the route cost to one or more of (i) another route cost for routing the signal wire via a different route and (ii) a pre-establish route cost desired; and
select a final route of the signal wire that minimizes a route cost for the signal wire between the first and second endpoints.

16. The data processing system of claim 15, wherein the route cost is based on a length of the signal wire between the first and second endpoints.

17. The data processing system of claim 15, wherein the route cost is based on a length of the shield wires between the first and second endpoints.

18. The data processing system of claim 15, wherein the route cost is based on a length of the signal wire between the first and second endpoints and a length of the shield wires between the first and second endpoints.

19. The data processing system of claim 15, wherein the route cost is based on an area associated with the signal wire between the first and second endpoints.

20. The data processing system of claim 15, wherein the signal wire is configured to carry a clock signal, and wherein the existing power supply shapes are part of an existing power mesh that is coupled to at least one of a first power supply node and a second power supply node.

* * * * *